United States Patent
Horikawa (10) Patent No.: US 6,372,611 B1
(45) Date of Patent: *Apr. 16, 2002

(54) SEMICONDUCTOR MANUFACTURING METHOD INCLUDING GETTERING OF METAL IMPURITIES

(75) Inventor: Mitsuhiro Horikawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,824

(22) Filed: Jan. 14, 1998

(30) Foreign Application Priority Data

Jan. 24, 1997 (JP) .............................. 9-025966

(51) Int. Cl.[7] .............................. H01L 21/322
(52) U.S. Cl. ....................... 438/473; 438/402; 438/471; 148/DIG. 60
(58) Field of Search ................. 438/471, 402, 438/473; 148/DIG. 60

(56) References Cited

U.S. PATENT DOCUMENTS

| | | | |
|---|---|---|---|
| 4,522,657 A | * | 6/1985 | Rohatgi et al. |
| 4,636,280 A | * | 1/1987 | Nakai et al. |
| 5,132,244 A | * | 7/1992 | Roy |
| 5,210,056 A | * | 5/1993 | Pong et al. |
| 5,541,141 A | * | 7/1996 | Cho |

(List continued on next page.)

FOREIGN PATENT DOCUMENTS

| | | |
|---|---|---|
| JP | 49-67566 | 7/1974 |
| JP | 61-264763 | 11/1986 |
| JP | 64-44023 | 2/1989 |
| JP | 3-16128 | 1/1991 |
| JP | 4-206932 | 7/1992 |
| JP | 4-369224 | 12/1992 |
| JP | 5-109736 | 4/1993 |
| JP | 5-129310 | 5/1993 |

(List continued on next page.)

OTHER PUBLICATIONS

Hartiti et al., Defect Generation and Gettering During RTP, pp. 96–104, (IEEE), 1992.*
Hartiti et al., Back Surface Field—Induced Gettering in Multicrystalline silicon, pp. 998–1001, 1991.*
"Latest LSI Process Technique", p. 320, Kogyo Chosakai, Jul. 25, 1983.
"Impurity behavior and gettering in Si", *Japanese Applied Physics*, vol. 60, No. 8, pp. 782–789.
"Evaluation of Gettering Efficiency in Silicon Wafer", *The Technical Report of the Institute of Electronics, Information and Communication Engineers*, SDM–93–165, Dec. 1993, pp. 83–89.
"Gettering in silicon", *J. Appl. Phys.*, 65(8), Apr. 15, 1989, pp. 2974–2985.

*Primary Examiner*—Long Pham
*Assistant Examiner*—Scott Brairton
(74) *Attorney, Agent, or Firm*—Young & Thompson (57) ABSTRACT

In a method of manufacturing a semiconductor device, a first polysilicon film is formed on a surface of a semiconductor substrate for a semiconductor element to be formed thereon. Ion implantation is performed in such a manner that impurity ions are implanted into the semiconductor substrate surface through the first polysilicon film. The semiconductor substrate is heated to a first temperature after the step of performing ion implantation. Then, the semiconductor substrate is gradually cooled with a predetermined cooling rate at least from a second temperature to a third temperature while the semiconductor substrate is cooled from the first temperature. The second and third temperatures are lower than the first temperature. Subsequently, the polysilicon film is removed after the gradually cooling step.

25 Claims, 4 Drawing Sheets

U.S. PATENT DOCUMENTS 5,631,199 A * 5/1997 Park
5,648,282 A * 7/1997 Yoneda
5,820,435 A * 10/1998 Cooper et al.
5,851,892 A * 12/1998 Lojek et al.

FOREIGN PATENT DOCUMENTS

| | | |
|---|---|---|
| JP | 5-275436 | 10/1993 |
| JP | 6-140410 | 5/1994 |
| JP | 6-140589 | 5/1994 |
| JP | 6-196490 | 7/1994 |

* cited by examiner

SEMICONDUCTOR MANUFACTURING METHOD INCLUDING GETTERING OF METAL IMPURITIES

BACKGROUND OF THE INVENTION

1. Field of the Invention

The present invention relates to a method of manufacturing a semiconductor device and, more particularly to a gettering technique for effectively removing metal impurities which are unintentionally introduced into a semiconductor substrate in a manufacturing process of a semiconductor device.

2. Description of the Related Art

An ion implanting process is indispensable to manufacture a semiconductor device such as an LSI (Large Scale Integrated circuit). However, the ion implanting process is a process in which contaminating heavy metal elements are introduced into a semiconductor substrate. For example, refer to "Impurity behavior and gettering in Si" by Yoshinori HAYAFUJI (a first reference, Japanese Applied Physics, Vol. 60, No. 8, pp. 782–789).

Further, when forming a well, after impurity ions are implanted, a heat treatment is performed at the temperature of 1,000° C. or higher to drive the implanted ions in a semiconductor substrate. Such a high temperature heat treatment is a process in which contaminating heavy metal elements are further introduced since the solid solubility of the contaminating heavy metal elements for a silicon substrate increases. Since the contaminating heavy metal elements introduced as mentioned above are a cause of large junction leakage current, a countermeasure is also required to reduce or eliminate contaminating metal impurities.

The gettering technique is an effective countermeasure technique for removing the contaminating heavy metal elements introduced as mentioned above, from device active regions of the semiconductor substrate.

As one intrinsic gettering (IG) method which is most generally used, a gettering method according to oxygen precipitates is known. Since supersaturated contaminating elements are gettered in the oxygen precipitates gettering method, the concentration of the contaminating elements which remain in the silicon wafer without being gettered does not decrease to the solid solubility.

As another gettering technique, a polysilicon back sealing method (to be referred to as a "PBS method", hereinafter) is known in which a polysilicon film is deposited on a surface of a silicon wafer on which a semiconductor device is not formed.

The gettering mechanism of the PBS method utilizes "segregation". Therefore, since the concentration of the contaminating elements remaining after the gettering is not limited by the solid solubility, this mechanism is considered to be more effective when cleaning technology in the manufacturing process of the semiconductor device is advanced. For example, refer to "Evaluation of Gettering Efficiency in Silicon Wafer" by Yoshinori Hayamizua et al., (second reference: the Technical report of the Institute of Electronics, Information and Communication Engineers", SDM-93-165, Dec. 1993, pp. 83–89).

In the method, however, there is a problem in that warpage occurs in a wafer since the polysilicon film is deposited on the silicon wafer usually to have a film thickness of 1000 nm or more. The problem is regarded as more important with the increase of wafer size in diameter.

A first conventional example of manufacturing method for solving such a problem is disclosed in, for example, Japanese Laid Open Patent Disclosure (JP-A-Heisei 5-109736). In the first conventional example of the semiconductor device manufacturing method, first, a gate oxide film is formed on the main front surface of a silicon wafer on which a semiconductor device is formed. After that, in a state in which the back surface of the silicon wafer is exposed, a first polysilicon film and a second polysilicon film are deposited onto both of the front and back surfaces of the silicon wafer.

Subsequently, ion implantation or phosphorus diffusion is performed to the first and second polysilicon films, thereby forming a first low resistance polysilicon film and a second low resistance polysilicon film, respectively.

Finally, the first low resistance polysilicon film is selectively etched and a gate electrode is formed.

According to the first conventional example of semiconductor device manufacturing method, since the polysilicon films exist on both of the front and back surfaces of the silicon wafer, the above-mentioned problem of the warpage is solved. The method has a process of forming the second polysilicon film as the second low resistance polysilicon film. Since the gettering ability of the second low resistance polysilicon film is stronger than that of the second polysilicon film, the first conventional example of the semiconductor device manufacturing method not only solves the problem of the warpage but also improves the gettering ability. Consequently, even when the diameter of the silicon wafer is increased, the conventional PBS method can be effective.

However, there is the following problem in the conventional PBS method. That is, fine patterning processes and high integration of the semiconductor device are also progressing more and more even at present. Thus, it is necessary to suppress diffusion of dopants in the portion where a transistor is formed. Also, it is necessary to decrease the temperature of heat treatment in the manufacturing process of the semiconductor device and to shorten the time of the heat treatment. Although a diffusion coefficient of the contaminating elements such as iron, nickel, copper, or the like is larger than that of the dopants such as phosphorus and boron, the decrease of the heat treatment temperature and shortening of the time of the heat treatment causes a problem for the gettering. This is because the contaminating elements unintentionally introduced by the ion implantation need to be diffused from the wafer front surface to the wafer back surface where gettering sites are present.

The gettering site of the PBS method is a grain boundary in the polysilicon film deposited on the back surface of the silicon wafer. For this reason, for purpose of the gettering of the contaminating elements, it is necessary that they are diffused from the wafer front surface by a distance corresponding to the thickness of the silicon wafer and reach the polysilicon film on the back surface of the wafer.

As mentioned above, in the PBS method, when the decrease in temperature and shortening of time of the heat treatment in the manufacturing process of the semiconductor device are advanced, there is a problem in that the diffusion length of the contaminating elements is limited so that the gettering becomes difficult.

Another gettering method is disclosed in Japanese Laid Open Patent Disclosure (JP-A-Heisei 6-140410) in which a polysilicon film and a silicon oxide film are formed on a wafer to collect contaminating elements between the polysilicon film and the silicon oxide film using $PoCl_3$ and then the silicon oxide film is etched to remove the gettered elements.

Still another gettering method is disclosed in Japanese Laid Open Patent Disclosure (JP-A-Heisei 4-206932) in which an element isolation film is formed on a polysilicon film which is formed on a part of a wafer and a silicon oxide film are formed on a wafer, an epitaxy layer is formed on the other part of the wafer so as to form a semiconductor device on the epitaxy layer.

SUMMARY OF THE INVENTION

The invention is made to solve the above-mentioned problems. Therefore, an object of the invention is to provide a method of manufacturing a semiconductor device, in which contaminating elements which are unintentionally introduced in a semiconductor substrate during a manufacturing process of the semiconductor device can be efficiently gettered and removed.

Another object of the invention is to provide a method of manufacturing a semiconductor device in which a manufacturing yield of the semiconductor device is improved and productivity is improved.

In order to achieve an aspect of the present invention, a method of manufacturing a semiconductor device, includes the steps of:

forming a first polysilicon film on a surface of a semiconductor substrate on which a semiconductor element is to be formed;

performing ion implantation such that impurity ions are implanted into the semiconductor substrate surface through the first polysilicon film;

heating the semiconductor substrate to a first temperature after the step of performing ion implantation;

gradually cooling the semiconductor substrate with a predetermined cooling rate at least from a second temperature to a third temperature while the semiconductor substrate is cooled from the first temperature, the second and third temperatures being lower than the first temperature; and removing the polysilicon film after the gradually cooling step.

The second temperature is preferably 800° C. and the third temperature is preferably 600° C. The heating step may be performed to activate the implanted impurity ions. The gradually cooling step may be performed to hold the semiconductor substrate at a fourth temperature during the gradually cooling step. The fourth temperature being equal to or lower than the second temperature and equal to or higher than the third temperature. In this case, the fourth temperature is in a range of 600° C. to 700° C.

The method may further include the step of forming an additional polysilicon film on the polysilicon film before the heating step. In this case, the polysilicon film and the additional polysilicon film are removed after the gradually cooling step.

The method may further include the step of forming a silicon oxide film between the semiconductor substrate surface and the polysilicon film before the step of forming the polysilicon film.

In order to achieve another aspect of the present invention, a method of manufacturing a semiconductor device, includes the steps of:

forming a silicon oxide film on a surface of a silicon substrate;

forming a first polysilicon film on the silicon oxide film;

forming a silicon nitride pattern on the first polysilicon film;

performing ion implantation such that impurity ions are implanted into the semiconductor substrate surface through the first polysilicon film and the silicon oxide film;

heating the semiconductor substrate to a first temperature after the step of performing ion implantation;

gradually cooling the semiconductor substrate with a predetermined cooling rate at least from a second temperature to a third temperature while the semiconductor substrate is cooled from the first temperature, the second and third temperatures being lower than the first temperature; and removing the first polysilicon film and the silicon nitride pattern after the gradually cooling step.

In this case, the silicon oxide film preferably has a film thickness equal to or thinner than 10 nm.

DESCRIPTION OF THE PREFERRED EMBODIMENTS

A method of manufacturing a semiconductor device of the present invention will be described below with reference to the accompanying drawings. First, the principle of the present invention will be described.

Contaminating heavy metal elements existing near a wafer front surface adversely affect the operation region of a semiconductor device. Therefore, the contaminating heavy metal elements should be removed. In the conventional PBS method, the contaminating heavy metal elements are gettered by a polysilicon film which is formed on a wafer back surface. For this reason, the contaminating heavy metal elements existing near the wafer front surface need to reach the wafer back surface such that those elements are gettered. However, when a lower temperature process and a shorter time period process are adopted in conjunction with fine processing of the semiconductor device, the diffusion rate of the contaminating elements is limited. In the conventional PBS method, therefore, there is a problem in that the gettering cannot be effectively performed.

On the other hand, in the present invention, a polysilicon film is formed on the wafer front surface and a grain boundary in the polysilicon film functions as a gettering site. Therefore, a diffusion distance is much shorter as compared to that in the conventional PBS method.

An ion implanting technique is widely used with an optional implantation energy value in a range from keV to MeV. When ions are implanted using the ion implantation energy of a practical MeV level, the ion implantation depth is as deep as about 3 μm. This value is at most about 1/240th of 725 μm which is a typical thickness of a semiconductor wafer having a diameter of 200 mm. A diffusion distance L can be expressed by $L^2 = Dt$, where D is a diffusion coefficient of the contaminating element and t is a time. The time period required when the contaminating elements diffuse by 3 μm is only 1/57600th times of that required when the contaminating elements diffuse by 725 μm.

In the present invention, ions are implanted into a silicon wafer through the polysilicon film formed on the wafer front surface. Generally, when the ions are implanted into the silicon wafer, the ions are implanted through a proper film in many cases to prevent the introduction of contaminating elements and channeling. In the present invention, a polysilicon film is chosen as such a proper film and heat treatment for activating the implanted ions also functions as the heat treatment for gettering the contaminating heavy metal elements. In this manner, it is unnecessary to add a new step of forming a polysilicon film for the purpose of the gettering and a step of performing the heat treatment. As a result, the number of manufacturing processes can be reduced.

The gettering heat treatment is performed to efficiently perform the gettering of the contaminating elements. The gettering process may be divided into the following three steps. For example, refer to "Gettering in silicon" by J. S. Kang and D. K. Schroder, (a third reference: J. Appl. Phys, 65(8), Apr. 15, 1989, pp. 2974–2979). In the third reference, the three steps are (1) emission of contaminating elements from a device active region, (2) diffusion of the emitted contaminating elements to the gettering sites, and (3) capture of the diffused contaminating elements by the gettering sites.

The emission of the contaminating elements from the device active region in the first steps occurs at the highest temperature of the heat treatment at which the implanted ions are activated. Generally, although re-emission progresses more at a higher temperature, the highest temperature of the heat treatment for activation is usually in a range from 800 to 1000° C. This temperature is a temperature at which the reemission of the contaminating elements is performed without any problem.

In the present invention, since the gettering sites exist near the device active region, it could be considered that the diffusion of the contaminating elements to the gettering sites occurs without any problem in the second step.

The capture of the contaminating elements by the gettering sites in the third step progresses more efficiently as the temperature decreases. Refer to the second reference. As a result, in the present invention, the silicon wafer is gradually cooled in a range from 800° C. to 600° C. in a cooling process after the activation heat treatment or is held at the temperature in a range of 700° C. to 600° C. Therefore, the gettering can be performed at a lower temperature. The contaminating elements are finally gettered by the polysilicon film on the wafer front surface and are removed together with the polysilicon film when the polysilicon film is removed by etching. As a result, the contaminating elements which have been once gettered by the polysilicon film are not re-emitted.

FIGS. 1A to 1E are cross sectional views for explaining a method of manufacturing a semiconductor device according to the first embodiment of the present invention in order of manufacturing steps.

Figure 1A:
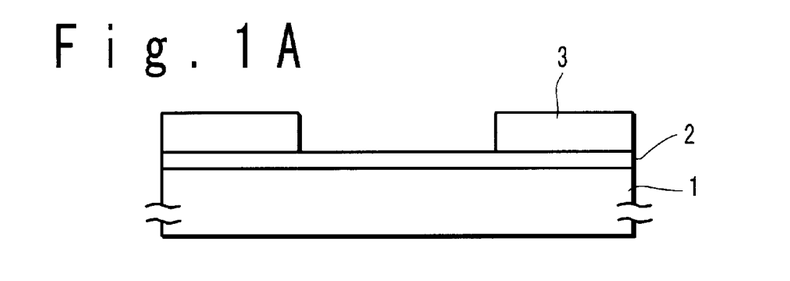
FIGS. 1A to 1E are cross sectional views of a semiconductor device in a manufacturing method according to a first embodiment of the present invention.

As shown in FIG. 1A, a first polysilicon film 2 is formed on the front surface of a boron doped p-type silicon wafer 1. Further, a photoresist layer 3 is coated onto the first polysilicon film 2. A photoresist of the photoresist layer 3 is removed where impurity ions are to be transplanted by use of a photolithography technique.

Figure 1B:
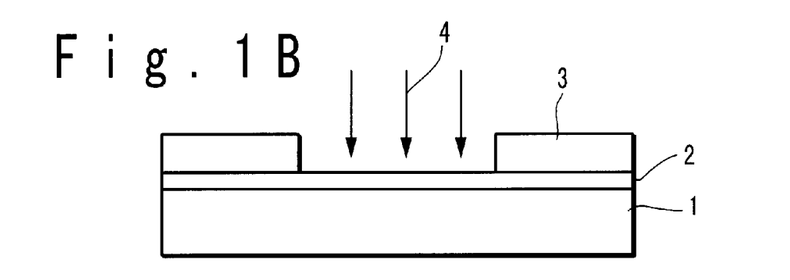

As shown in FIG. 1B, subsequently, the ion implantation of phosphorus ions ($P^+$) 4 is performed. The present invention is not limited to the phosphorus ions ($P^+$) but ions of another element such as boron, arsenic or the like may be used. In the portion where the photoresist layer 3 remains, the ions are not implanted into in the silicon wafer 1.

Figure 1C:
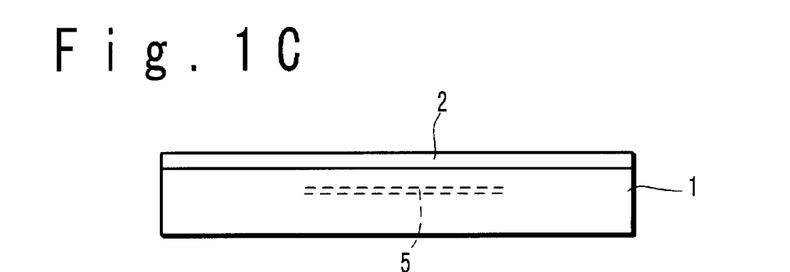

As shown in FIG. 1C, after completion of the ion implantation, the whole photoresist layer 3 is removed. In this state, the implanted phosphorus ions ($P^+$) locally exist near a range 5 which is determined based on an implanting energy and the thickness of the first polysilicon film 2. After that, heat treatment is performed to activate the implanted ions. In this heat treatment, the gettering of contaminating elements unintentionally introduced during the ion implantation is performed simultaneously with the activation of the implanted ions.

Figure 1D:
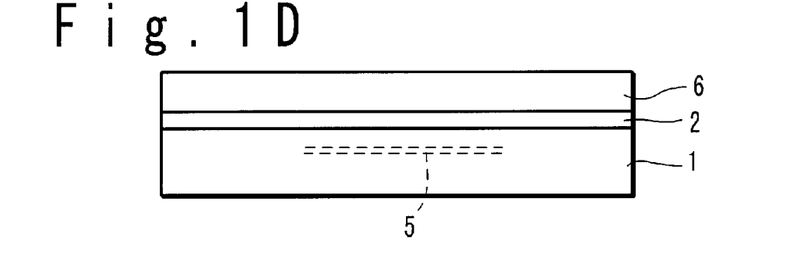

As shown in FIG. 1D, a second polysilicon film 6 is formed on the first polysilicon film 2 before the heat treatment, if necessary.

Figure 1E:
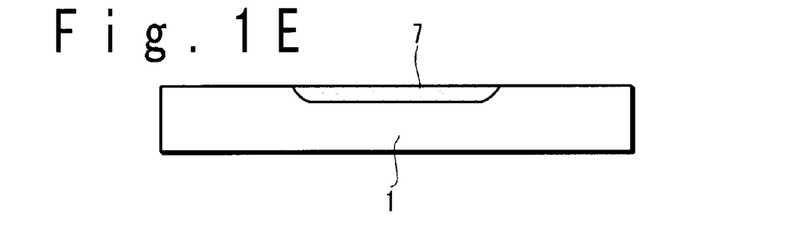

As shown in FIG. 1E, after completion of the heat treatment, the first polysilicon film 2 or the first polysilicon film 2 and the second polysilicon film 6 are removed. Thus, a diffusion layer is formed.

The first embodiment of the present invention will now be described in detail with reference to FIGS. 2A to 2C.

Figure 2A:
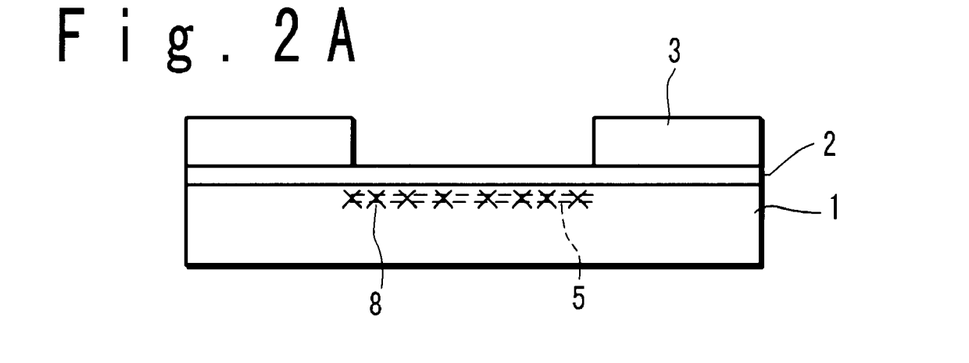
FIGS. 2A to 2C are cross sectional views of the semiconductor device to explain the gettering operation in the manufacturing method according to the first embodiment of the present invention.

FIG. 2A is a cross sectional view schematically showing a state of the contaminating heavy metal elements introduced during the ion implantation.

Figure 3:
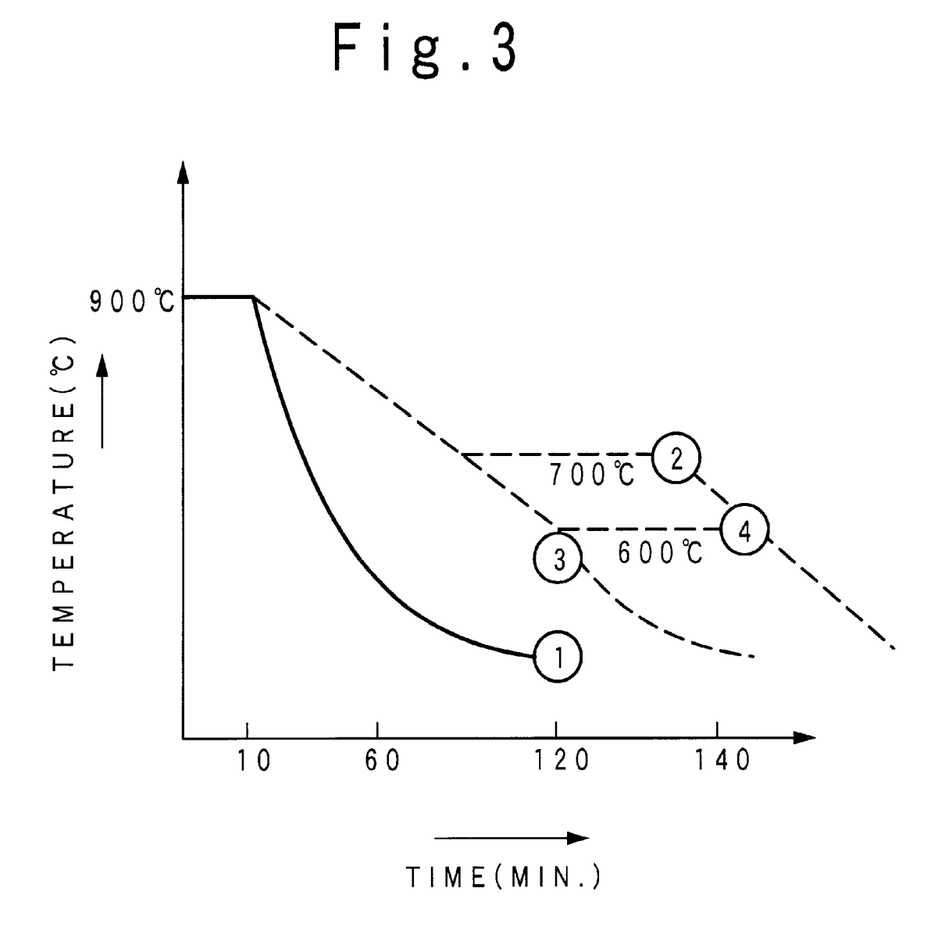
FIG. 3 is a diagram to explain a heat treatment process in the manufacturing method according to the first embodiment of the present invention.

After that, the photoresist layer 3 is removed and the heat treatment is performed at the temperature of 900° C. to activate the implanted elements. After the heat treatment, the silicon wafer is gradually cooled at least in a range of 900° C. to 600° C., as shown in FIG. 3. Alternatively, during the gradually cooling process, the silicon wafer may be held at a predetermined temperature, e.g., the temperature of 700° C. or below, for a predetermined time period. In this manner, the gettering can be efficiently performed.

In the segregating type of gettering, the gettering efficiency n is given by the following equation (1).

$$\eta=(k-1)/(k+w1/w2) \qquad (1)$$

where, k is a segregation coefficient of the contaminating element between silicon single crystal and polysilicon, w1 is the thickness of the silicon wafer 1, and w2 is the thickness of the first polysilicon film 2.

As seen from the above equation (1), it could be understood that the thicker the first polysilicon film 2, the higher the efficiency $\eta$ is. Therefore, as described with reference to FIG. 1D, if the second polysilicon film 6 is formed onto the first polysilicon film 2 before the heat treatment, the efficiency $\eta$ can be increased.

When A, B, and C represent constants, because the segregation coefficient k can be expressed by the form of the following equation (2), the efficiency $\eta$ can be expressed by the following equation (3) from the above equation (1).

$$k=1+A\cdot\exp(B/T) \qquad (2)$$

$$\eta=1/(C\cdot\exp(-B/T+1)) \qquad (3)$$

where T is absolute temperature.

It could be understood from the above equations that the lower the temperature T, the higher the efficiency $\eta$. This is the reason why the silicon wafer is gradually cooled at least in a range from 900° C. to 600° C. during the cooling process after the heat treatment or the silicon wafer is held at the temperature of 700° C. or below.

Figure 2B:
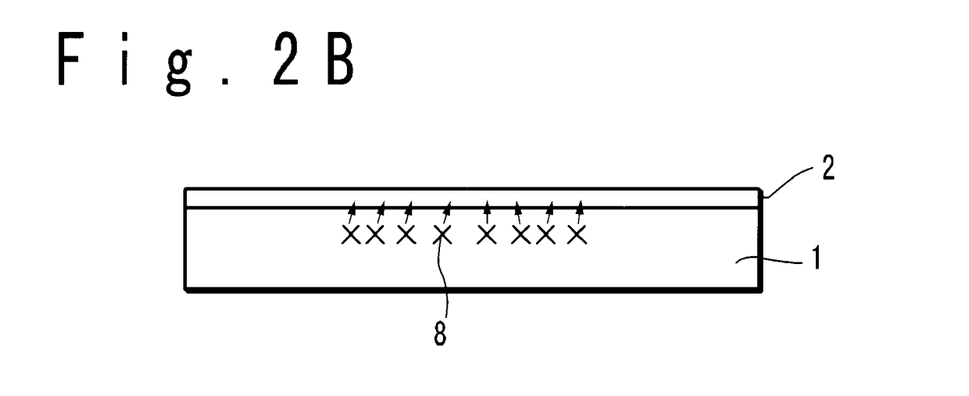

As shown in FIG. 2B, the contaminating heavy metal elements 8 are diffused into the first polysilicon film 2 and are gettered through the above processes.

Figure 2C:
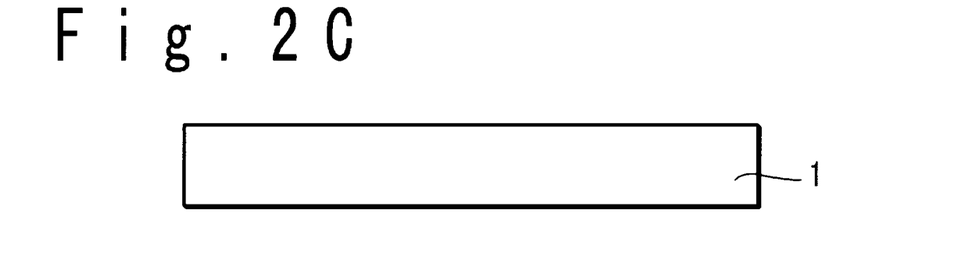

As shown in FIG. 2C, subsequently, the first polysilicon film 2 is removed. At this time, since the contaminating elements have been gettered in the first polysilicon film 2, they are simultaneously removed to the outside of the silicon wafer 1.

EXAMPLES

TABLE 1

|  | Heat treat-ment | Thickness of poly-Si film 1 | Thickness of poly-Si film 2 | Leakage current in 5 V, at room temp. |
|---|---|---|---|---|
| Comparison example 1 | ① | 30 nm | non | 8.2 E −14 A |
| Example 1 | ② | 30 nm | non | 2.1 E −14 A |
| Example 2 | ③ | 30 nm | non | 7.3 E −15 A |
| Example 3 | ④ | 30 nm | non | 4.5 E −15 A |
| Example 4 | ③ | 30 nm | 50 nm | 1.6 E −15 A |
| Comparison example 2 | ③ | Silicon oxide film of 30 nm | non | 9.4 E −14 A |

A table 1 is a table for explaining the effect of the first embodiment of the present invention. Results evaluated by a junction leakage current (the diffusion layer has a square shape of 500 μm×500 μm) are shown with respect to Examples 1 to 4 and Comparison examples 1 and 2. The polysilicon films 1 and 2 in the table 1 show the first and second polysilicon films 2 and 6 in the first embodiment.

The number of the heat treatment in Table 1 corresponds to the number in FIG. 3. An example in which the highest temperature of the heat treatment for activation of the ion implanted elements is equal to 900° C. is shown here.

Referring to FIG. 3, the process ① is such a process that after the silicon wafer is heated to the temperature of 900° C., the wafer is taken out. Therefore, in this process ①, the silicon wafer is cooled in the natural ambience from 900° C. to the room temperature. This cooling process is a rapid cooling process from a viewpoint of contaminating elements being diffused to the gettering sites mentioned above.

The process ② is such a process that after the wafer is gradually cooled to 700° C. at a rate of 3° C./min., the wafer is held at the temperature of 700° C. for about 20 min. and then is also gradually cooled to the room temperature at a rate of 3° C./min. However, the wafer may be taken out after being held at the temperature of 700° C.

The process ③ is such a process that after the wafer is cooled to 600° C. at a rate of 3° C./min. the wafer is taken out.

The process ④ is such a process that after the wafer is gradually cooled to 600° C. at a rate of 3° C./min., the wafer is held at the temperature of 600° C. for about 20 min. and then is also gradually cooled to the room temperature at a rate of 3° C./min. However, the wafer may be taken out after being held at the temperature of 600° C.

In Example 1, the process ② is employed, the thickness of first polysilicon film is equal to 30 nm, and no second polysilicon film is formed.

In Example 2, the process ③ is employed, the thickness of first polysilicon film is equal to 30 nm, and no second polysilicon film is formed.

In Example 3, the process ④ is employed, the thickness of first polysilicon film is equal to 30 nm, and no second polysilicon film is formed.

In Example 4, the process ③ is employed, the thickness of first polysilicon film is equal to 30 nm, and the second polysilicon film is formed to have the thickness of 50 nm.

In Comparison example 1, the process ① is employed, the thickness of first polysilicon film is equal to 30 nm, and no second polysilicon film is formed.

In Comparison example 2, the process ③ is employed, the thickness of silicon oxide film is equal to 30 nm, and no second polysilicon film is formed.

Comparing with the Comparison example 1, it will be understood from the results of the Examples 1 to 3 that the gradually cooling process and/or the holding process of the wafer at the temperature of 700° C. or below after the heating process for activating the implanted ions decrease the junction leakage current.

Comparing Examples 2 and 4, when the second polysilicon film 6 is further formed, it is confirmed that the junction leakage current is further decreased.

Comparing Example 2 with Comparison example 2, even if the wafer is gradually cooled after the heat treatment, the junction leakage is not reduced in the case where the silicon oxide film is formed instead of the polysilicon film.

The method of manufacturing a semiconductor device according to the second embodiment of the present invention will now be described with reference to FIGS. 4A to 4D. FIGS. 4A to 4D show an example in which the present invention is applied to the process of forming device isolation films during the manufacturing process.

Figure 4A:
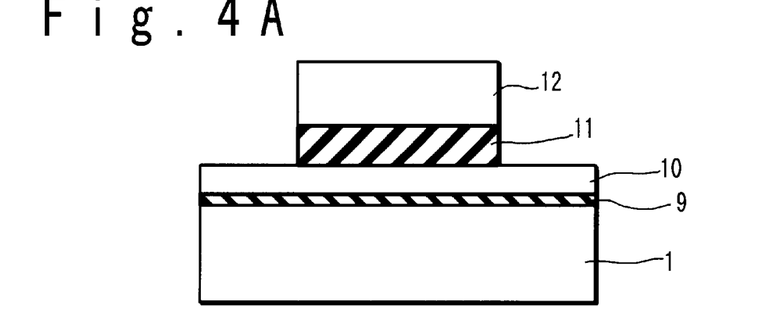
FIGS. 4A to 4D are cross sectional views of a semiconductor device in a manufacturing method according to the first embodiment of the present invention.

As shown in FIG. 4A, a silicon oxide film 9 and a polysilicon film 10 are formed on a p-type silicon wafer 1. The silicon oxide film 9 has the film thickness of 10 nm or less. A silicon nitride film 11 and a photoresist layer 12 are left in the portion except for the portion where the device isolation films should be formed. Those films are removed from the other portion.

Figure 4B:
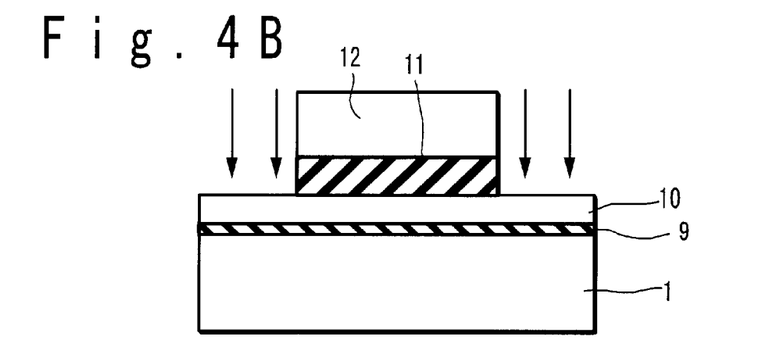

Next, as shown in FIG. 4B, boron ions 13 are implanted into the portion where the silicon nitride film 11 and the photoresist layer 12 do not exist to form regions serving as a channel stopper.

Figure 4C:
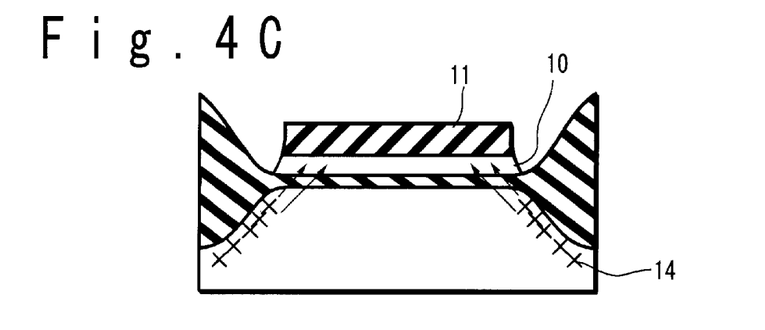

After that, as shown in FIG. 4C, a thermally oxidizing process is performed to form the element isolation films. After the thermally oxidizing process, the wafer is gradually cooled at a predetermined cooling rate to a temperature near the room temperature, as in the first embodiment. During the gradually cooling process, the wafer may be held at the temperature of 700° C. or below. Contaminating heavy metal elements which are unintentionally introduced in the wafer and located around the element isolation films can be gettered in the first polysilicon film 10 through the silicon oxide film 9 during the thermally oxidizing process and the cooling process.

Figure 4D:
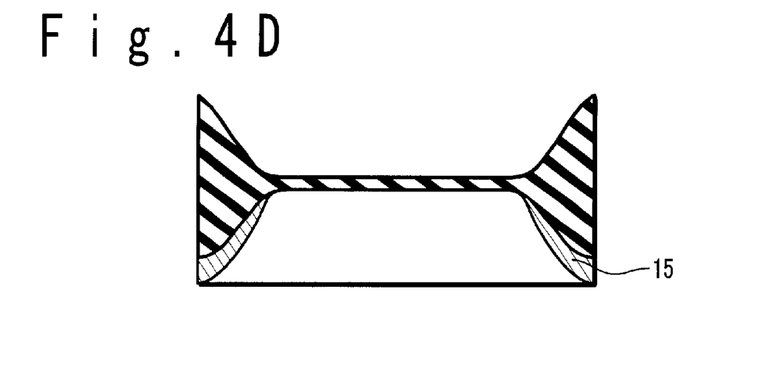

Finally, as shown in FIG. 4D, when the first polysilicon layer 10 and silicon nitride film 11 are removed, the wafer is obtained as shown in FIG. 4D.

TABLE 2

|  | Heat treat-ment | Thickness of poly-Si film 1 | Thickness of poly-Si film 2 | Leakage current in 5 V, at room temp. |
|---|---|---|---|---|
| Comparison example 3 | ① | 50 nm | non | 9.7 E −14 A |
| Example 5 | ② | 50 nm | non | 3.4 E −14 A |
| Example 6 | ③ | 50 nm | non | 8.9 E −15 A |
| Example 7 | ④ | 50 nm | non | 6.7 E −15 A |
| Example 8 | ③ | 50 nm | 30 nm | 3.1 E −15 A |
| Comparison example 4 | ③ | non | non | 1.3 E −14 A |

In the first embodiment, when the silicon oxide film is formed, the leakage current is not decreased. This is because the silicon oxide film is thick in the first embodiment. On the other hand, in the second embodiment, the silicon oxide film has the film thickness of 10 nm or less only. Therefore, the contaminating elements can pass through the silicon oxide film and can be captured by the polysilicon film.

The Table 2 is a table for explaining the effect of the second embodiment and results evaluated by the junction leakage current are shown with respect to Examples 5 to 8 and Comparison examples 3 and 4.

In the Table 2, each number of the process after heat treatment corresponds to the number in FIG. 3. Explanation of the processes corresponding to those numbers is omitted because the same processes as those in the above first embodiment are used. In the second embodiment, although diffusion layers in which the junction leakage current is measured have the same area as that of the diffusion layer in the first embodiment of Table 1, a length of region in contact with the element isolation film is 200 times as long as that of the first embodiment of Table 1. Such a long length is for purpose of evaluating the junction leakage current flowing at the element isolation film edge.

In Example 5, the process ② is employed, the thickness of the first polysilicon film is equal to 50 nm, and no second polysilicon film is formed.

In Example 6, the process ③ is employed, the thickness of the first polysilicon film is equal to 50 nm, and no second polysilicon film is formed.

In Example 7, the process ④ is employed, the thickness of the first polysilicon film is equal to 50 nm, and no second polysilicon film is formed.

In Example 8, the process ③, the thickness of the first polysilicon film is equal to 50 nm, and the second polysilicon film is formed to have the thickness of 30 nm.

In Comparison example 3, the process ① is employed, the thickness of the first polysilicon film is equal to 50 nm, and no second polysilicon film is formed.

In Comparison example 4, the process ③ is employed, neither first polysilicon film nor second polysilicon film is formed.

In a manner similar to the result of Table 1, even in the second embodiment, the effect of the present invention was confirmed. More particularly, in an advanced memory such as a DRAM or the like, the junction leakage current flowing in the element isolation film edge causes a problem. In the second embodiment, it has been found that the junction leakage current flowing in the element isolation film edge can be reduced.

As described above, according to the present invention, since the junction leakage current can be reduced, the refreshing characteristics of the DRAM are improved. Therefore, it is effective to apply the present invention to the semiconductor device such as the DRAM which needs the realization of high integration and low electric power consumption.

Also, as described above, according to the manufacturing method of the semiconductor device of the present invention, there is an effect in that the contaminating heavy metal elements which are unintentionally introduced in the ion implantation can be effectively gettered. Therefore, according to the present invention, a manufacturing yield and productivity of the semiconductor devices can be improved. This is because the polysilicon film having high gettering ability is selected as a film through which the ions pass at the time of the ion implantation and is formed on the wafer front surface. Therefore, it is sufficient that the distance where the contaminating elements are diffused to the gettering sites is short. This is also because the gettering efficiency can be improved through the gradually cooling process in a range of 800° C. to 600° C. at least during the cooling process after the heat treatment for activating the implanted ions. In addition, the wafer may be held at temperature of 700° C. or below. Further, if the polysilicon film is formed thicker, the gettering ability can be further improved.

What is claimed is:

1. A method of manufacturing a semiconductor device, comprising the steps of:

forming a first polysilicon film on a surface of a semiconductor substrate on which a semiconductor element is to be formed;

performing ion implantation such that impurity ions are implanted into said semiconductor substrate surface through said first polysilicon film;

heating said semiconductor substrate to a first temperature that is less than 1000° C. after said step of performing ion implantation;

gradually cooling said semiconductor substrate at a constant cooling rate of about 3° C. per minute at least from a second temperature to a third temperature while said semiconductor substrate is cooled from said first temperature, said second and third temperatures being lower than said first temperature; and removing said polysilicon film after said gradually cooling step.

2. A method according to claim 1, wherein said second temperature is 800° C. and said third temperature is 600° C.

3. A method according to claim 1, wherein said heating step includes activating said implanted impurity ions by heating said semiconductor substrate to said first temperature.

4. A method according to claim 1, wherein said gradually cooling step includes holding said semiconductor substrate at a fourth temperature during said gradually cooling step, said fourth temperature being lower than said second temperature and equal to or higher than said third temperature.

5. A method according to claim 4, wherein said fourth temperature is in a range of 600° C. to 700° C.

6. A method according to claim 1, further comprising the step of:

forming an additional polysilicon film on said polysilicon film before said heating step.

7. A method according to claim 6, further comprising the step of:

removing said polysilicon film and said additional polysilicon film after said gradually cooling step.

8. The method of claim 1, wherein a cooling time during the gradual cooling step is longer than 70 minutes.

9. The method of claim 8, wherein the substrate is cooled for a time period longer than 70 minutes and a temperature during this time period is less than 700° C.

10. A method of gettering a semiconductor material, comprising the steps of:

forming a first polysilicon layer on a surface of the semiconductor material from which impurities are to be gettered;

implanting ions through the first polysilicon layer into the surface of the semiconductor material;

gettering the impurities in the semiconductor material into the first polysilicon layer by first heating the semiconductor material to a first temperature of at least 800° C. and less than 1000° C. to activate the implanted ions, then cooling the semiconductor material at a constant cooling rate of about 3° C. per minute to a second temperature that is from 600° C. to 700° C., and then cooling the semiconductor material from the second temperature; and removing the first polysilicon layer to remove the gettered impurities captured therein.

11. The method of claim 10, further comprising the step of maintaining the second temperature for a period of time sufficient to allow the impurities to migrate into the first polysilicon layer.

12. The method of claim 11, wherein the time period is about 20 minutes.

13. The method of claim 10, wherein the step of cooling from the second temperature is also at a constant cooling rate.

14. The method of claim 13, wherein the constant cooling rate is the same when cooling from the first temperature and when cooling from the second temperature.

15. The method of claim 10, further comprising the step of maintaining the second temperature for a period of time sufficient to allow the impurities to migrate into the first polysilicon layer and wherein the step of cooling from the second temperature is at the same constant cooling rate as when cooling from the first temperature.

16. The method of claim 15, wherein the time period is about 20 minutes.

17. The method of claim 15, further comprising the steps of forming a second polysilicon layer on the first polysilicon layer between the ion implantation and heating steps, and removing the second polysilicon layer when removing the first polysilicon layer.

18. The method of claim 1, wherein the semiconductor substrate is cooled at the constant cooling rate from the first temperature.

19. A method of manufacturing a semiconductor device, comprising the steps of:

forming a first polysilicon film on a surface of a semiconductor substrate on which a semiconductor element is to be formed;

performing ion implantation such that impurity ions are implanted into said semiconductor substrate surface through said first polysilicon film;

heating said semiconductor substrate to a first temperature after said step of performing ion implantation;

cooling said semiconductor substrate for a time longer than 86 minutes from a second temperature to a third temperature while said semiconductor substrate is being cooled from said first temperature, said second and third temperatures being lower than said first temperature; and removing said polysilicon film after said cooling step, wherein said cooling step further comprises the step of cooling said semiconductor substrate at a constant cooling rate of about 3° C. per minute for a portion of the time and holding at a constant temperature for another portion of the time.

20. The method according to claim 19, wherein said second temperature is 800° C. and said third temperature is 600° C.

21. The method according to claim 19, wherein said heating step includes activating said implanted impurity ions by heating said semiconductor substrate to said first temperature.

22. The method according to claim 19, wherein said gradually cooling step includes holding said semiconductor substrate at a fourth temperature during said gradually cooling step, said fourth temperature being lower than said second temperature and equal to or higher than said third temperature.

23. The method according to claim 22, wherein said fourth temperature is in a range of 600° C. to 700° C.

24. The method according to claim 19, further comprising the step of:

forming an additional polysilicon film on said polysilicon film before said heating step.

25. The method according to claim 24, further comprising the step of:

removing said polysilicon film and said additional polysilicon film after said gradually cooling step.

* * * * *